(12) United States Patent
Demharter

(10) Patent No.: US 7,689,959 B2
(45) Date of Patent: Mar. 30, 2010

(54) CODE GENERATOR FOR FINITE STATE MACHINES

(75) Inventor: Nikolaus Demharter, Dormitz (DE)

(73) Assignee: Siemens Aktiengesellschaft, Munich (DE)

(*) Notice: Subject to any disclaimer, the term of this patent is extended or adjusted under 35 U.S.C. 154(b) by 395 days.

(21) Appl. No.: 11/714,643

(22) Filed: Mar. 6, 2007

(65) Prior Publication Data

US 2007/0245303 A1    Oct. 18, 2007

(30) Foreign Application Priority Data

Mar. 7, 2006  (DE) .................. 10 2006 010 534

(51) Int. Cl.
*G06F 17/50*   (2006.01)
*G06F 9/455*   (2006.01)
*G06G 7/62*    (2006.01)

(52) U.S. Cl. .................. 716/7; 716/4; 703/16; 703/17; 703/28

(58) Field of Classification Search ............. 716/7, 716/4; 703/16, 17, 28
See application file for complete search history.

(56) References Cited

U.S. PATENT DOCUMENTS

| | | | |
|---|---|---|---|
| 5,649,176 A * | 7/1997 | Selvidge et al. ............ 713/400 |
| 6,324,496 B1 * | 11/2001 | Alur et al. .................... 703/17 |
| 7,281,225 B2 * | 10/2007 | Jain et al. ...................... 716/5 |
| 2002/0178423 A1 * | 11/2002 | Ben-David et al. ............ 716/4 |
| 2004/0019883 A1 | 1/2004 | Banerjee et al. |
| 2005/0138474 A1 * | 6/2005 | Jain et al. ..................... 714/30 |
| 2007/0294655 A1 * | 12/2007 | Campos et al. ............... 716/12 |

FOREIGN PATENT DOCUMENTS

JP         01221683 A  *  9/1989

* cited by examiner

*Primary Examiner*—Phallaka Kik

(57) ABSTRACT

The present invention relates to a method for automatically generating HDL code, a code generator and a product for generating the code for the purpose of its implementation in programmable logic, based on a graphical representation for coding a state machine. With the method according to the invention, state transitions are executed on the basis of a modified query structure in that, starting from a target state, all the preconditions are derived which must be fulfilled in order to reach said target state.

13 Claims, 8 Drawing Sheets

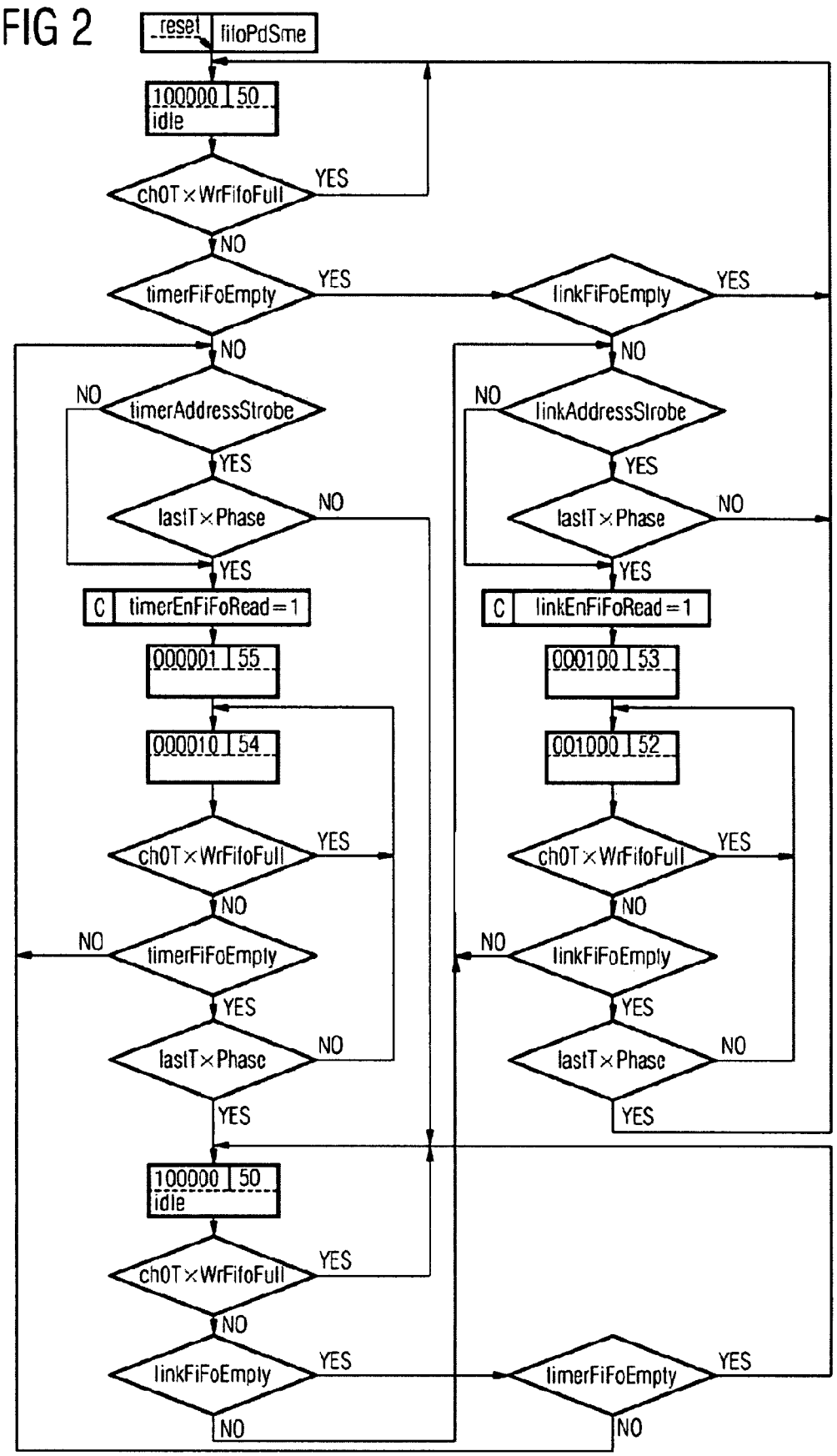

FIG 3A  PRIOR ART

```
CASE (Dfl_StateVector) IS
    WHEN Dfl_SW_S0 => DFL
    WHEN Dfl_SW_S1 => DFL
    WHEN Dfl_SW_S2 => DFL
    WHEN Dfl_SW_S3 => DFL
    WHEN Dfl_SW_S4 => DFL
    WHEN Dfl_SW_S5 => DFL
    WHEN OTHERS => DFL_SID
END CASE;
```

FIG 3B

```
SME_StateVector(3) <= SME_StateVector(2) or
    ((not(lastTxPhase_H)) and (((linkFifoEmpty_H) and (((not(chOTxWrFifoFull_H)) and
    (not(chOTxWrFifoFull_H)))))) or ((chOTxWrFifoFull_H) and (SME_StateVector(3))) and
    (SME_StateVector(3)))))));
```

FIG 4A  PRIOR ART

--declaration of signals for assertion level compensation
    SIGNAL linkFifoAlmostEmpty : std_logic;
    SIGNAL linkFifoEmpty : std_logic;
    SIGNAL reset : sdt_logic;
    SIGNAL timerFifoAlmostEmpty : sdt_logic;
    SIGNAL lastTxPhase : std_logic;
    SIGNAL timerFifoEmpty : std_logic;
    SIGNAL ch0TxWrFifoFull : sdt_logic;
    SIGNAL timerAddressStrobe : std_logic;
    SIGNAL linkAddressStrobe : std_logic;
    SIGNAL linkEnFifoRead : std_logic;
    SIGNAL timerEnFifoRead : std_logic;
--declaration of variables --declaration of state out signals --declaration of named expressions --declaration of synchronisation signals --for outputs, variables and stateOuts
    SIGNAL Dfl_Next_linkEnFifoRead : std_logic;
    SIGNAL Dfl_Next_timerEnFifoRead : std_logic;
--declaration of reset signals
    SIGNAL Dfl_ResetExpression :std_logic;
    SIGNAL Dfl_ResetFlag         :std_logic;
--declaration of the state vector
    SIGNAL Dfl_StateVector : Dfl_StateVector Type;
    SIGNAL Dfl_Next_Dfl_StateVector : Dfl_StateVector Type;

FIG 4B

--declaration of expressions
    SIGNAL SME_ResetExpressions : std_logic;

--declaration of statenames for simulation
    SIGNAL  SME_StateVector : std:logic_vector(5 downto 0);

FIG 5

```
--pragma translate_off
SME_sim_states : PROCESS (SME_StateVector)
BEGIN -- PROCESS SME_sim_states
    CASE SME_StateVector IS
        WHEN  "100000"  =>  SME_SimState<= S0;
                            SME_NamedState<=idle_S0;
        WHEN  "010000"  =>  SME_SimState <= S1;
                            SME_NamedState <= idle_S1;
        WHEN  "001000"  =>  SME_SimState <=S2;
                            SME_NamedState <=a_S2;
        WHEN  "000100"  =>  SME_SimState <=S3;
                            SME_NamedState <=a_S3;
        WHEN  "000010"  =>  SME_SimState <= S4;
                            SME_NamedState <=a_S4;
        WHEN  "000001"  =>  SME_SimState <=S5;
                            SME_NamedState <= a_S5;
        when others    =>   SME_SimState <= WOIS_NET;
                            SME_NamedState <= WOIS_NET;
    END CASE;
END PROCESS SME_sim_states;
--pragma translate_on
```

FIG 6

```
PROCEDURE DFL_SID_881 IS
    VARIABLE Dfl_QueryValue : SDT_LOGIC_VECTOR (0 downto 0);
    BEGIN
        Dfl_QueryValue:=(Dfl_To_X01Vector(timerFifoEmpty));
        --pragma translate_off
        if(Is_X(Dfl_QueryValue))
            THEN
            Dfl_Next_Dfl_StateVector<="XXXXXX";
            RETURN;
        END IF;
    --pragma translate_on
        IF (Dfl_istrue(Dfl_QueryValue))
            THEN DFL_SID_885
            ELSE DFL_SID_1038
            END IF;
    END DFL_SID_881;
```

FIG 7B

Quartus II-K:/project/starnode/synthesis/quartus/smectest-fifoRdSme

File Edit View Project Assignments Processing Tools Window Help fifoRdSme

Entity

Stratix GX: EP1SGX10CF672C7
  fifoRdSme

| | Logic Cells | LC Registers | Pins | LUT-Only LCs | LUT/ Register LCs |
|---|---|---|---|---|---|
| | 17(17) | 6 | 12 | 11(11) | 6(6) |

Hierarchy | Files | Design Units

Compilation Report

- Compilation Report
  - Legal Notice
  - Flow Summary
  - Flow Settings
  - Flow Elapsed Time
  - Flow Log
  - Analysis & Synthesis
  - Filter
  - Assembler
  - Timing Analyzer Timing Analyzer Summary

| | Type | Slack | Required Time | Actual Time |
|---|---|---|---|---|
| 1 | Worst-case tsu | N/A | None | 4.294 ns |
| 2 | Worst-case tco | N/A | None | 9.296 ns |
| 3 | Worst-case tpd | 0.089 ns | 7.000 ns | 6.911 ns |
| 4 | Worst-case th | N/A | None | 0.892 ns |
| 5 | Clock Setup: 'clk_H' | -0.148 ns | 400.00 MHz (period = 2.500ns) | 377.64 MHz (period = 2.648 6ns) |
| 6 | Clock Hold: 'clk_H' | 1.309 ns | 400.00 MHz (period = 2.500ns) | N/A |

US 7,689,959 B2

CODE GENERATOR FOR FINITE STATE MACHINES

CROSS REFERENCE TO RELATED APPLICATIONS

This application claims priority of German application No. 10 2006 010 534.6 filed Mar. 7, 2006, which is incorporated by reference herein in its entirety.

FIELD OF THE INVENTION

The invention relates to a method, a device and a product for a code generator for describing finite state machines in a hardware description language for the purpose of their implementation in hardware.

BACKGROUND OF THE INVENTION

State machines (or finite state machines, as they are also called) can be defined as self-contained systems having a set of "states" and certain "transitions" between these states. They are often used in the design of digital circuits. There are a number of development tools on the market for implementing state machines in programmable logic (such as e.g. PLDs, CPLDs or FGPAs). State machines can be divided into two classes according to the type of result or, as the case may be, output they yield. On the one hand there are Moore state machines, whose output is simply a function of the current state. Mealy state machines, on the other hand, are characterized in that one or more outputs is/are a function of the current state and one or more inputs.

The usual approach in contemporary hardware design is, in a first step, to generate a VHDL code or a code in another hardware description language in order then, in a second step, to convert said code into a logic circuit using a synthesis tool. There are basically two options for generating the VHDL code: Firstly, it is possible to write the VHDL code by hand using a text editor for example. Secondly, it is possible to use a tool, specifically a graphical model with predefined syntax, which simplifies and automates the description of state machines and in addition results in a unique and syntactically error-free code. When using the aforementioned graphical input it is, however, necessary to use an additional code generator which converts the graphical model (or, as the case may be, the graphic) into VHDL code by interpreting the graphic.

If the first of the aforementioned possibilities is chosen and the VHDL code is programmed manually, this is more problematical, more complicated and time-consuming, and less convenient, and has the disadvantages that the VHDL code may not be unique and possibly not free of syntactical errors.

In order to avoid the aforementioned disadvantages and in the interests of improved clarity, the most common practice is therefore to use a graphic, in other words to opt for the second of the aforementioned possibilities.

A problem with the previous code generation based on a graphical input mode is to be seen in the fact that the generated code exhibits a lack of efficiency, since often unnecessarily many gates or, as the case may be, cells are generated and the clock frequency is low.

In order to overcome these disadvantages it is known in the prior art to use what is referred to as "one-hot coding". With one-hot coding, each state is described by an individual bit in the state vector. Although in this type of coding a greater number of bits are used for coding the respective states, usually only the relevant bit in each case must be realized in code during the subsequent decoding. In practice, however, it has been found that nonetheless, in the customary method of describing state machines, all bits of the state vector must be realized in code (and not just the relevant bit in each case, as the one-hot coding approach actually proposes).

The existing prior art solutions therefore reveal themselves as deficient.

SUMMARY OF THE INVENTION

The object of the present invention is therefore to reveal a way in which the generated hardware code can be improved, in particular in respect of synthesis, execution time and area, and in particular can be designed more efficiently, and in which the generated code is free of syntactical errors and is unique.

This object is achieved by the accompanying independent main claims, in particular by means of a method, by means of a code generator and by means of a product.

The object is realized in particular by means of a method for generating a code for implementation in hardware, in particular in programmable logic, and for coding a state machine in which state transitions are executed—no longer as previously—based on the evaluation of a case state vector, but in which the generated code is described in the form of a logic equation, with the result that a backward-directed query is performed which, starting from a target state of the state machine, derives all input signals and initial states and their assignments which are necessary in order to reach the respective target state.

In the description of a state machine in the prior art, the typical approach is to resort to the case state vector construct. With the case state vector construct, a forward-directed query of initial state and input signals is performed, which then lead to a target state.

Disadvantageously, the existing prior art approach using a case state vector construct requires that at least a part of the logic thus generated has to be decoded. For this reason said approach is very time-consuming and labor-intensive, since additional logic first has to be built in order to analyze the state vector. Furthermore, usually more gates are generated than necessary.

In contrast thereto, the solution according to the invention dispenses with such a use of the case state vector construct. This leads to a series of advantages which have been described or are still to be described in connection with the respective features.

In the preferred embodiment, processing of internal intermediate signals is dispensed with to the greatest possible extent. This has the advantage that the respective section containing the signal declarations in the previous code (i.e. the code generated using the existing prior art code generators) is substantially longer than the corresponding section in the case of the code generated by means of the method according to the invention.

In the hardware development too, all preliminary phases for generating programmable are basically subjected to a check to verify freedom from error. An important factor in the error check is to be seen in the clearly organized structure of the code. When using case state vectors it is possible to generate a clearly structured code. The inventive solution also exploits this advantage in an advantageous development by also representing in addition the case state vector typically used previously. An important characteristic in this arrangement is, however, that the case state vector is represented only in a symbolic manner in the generated code. This can be for example in the form of a comment which, though being generated, is not taken into account any further during the subsequent synthesis. It can only be used within the framework of the simulation. This advantageously leads to easier debugging compared to a code generated according to the invention which does not include the case state vector or the state vector. By using the state vector only during the simulation and not in the subsequent synthesis it is advantageously possible that no additional gates need to be generated.

During the code generation process and the subsequent simulation and verification of the generated code, undefined signals recurrently occur which are characterized in that they cannot be uniquely assigned one of the two binary states ("0" or "1"). An advantage of the solution according to the invention is to be seen in the fact that the generated code is considerably more robust with regard to the processing of undefined signals, in particular during the simulation. In a further, very advantageous embodiment of the invention it is provided that the code generated according to the invention is mapped to memory cells so that the input signals and their respective combinations or, as the case may be, assignments are mapped to the addresses of the memory cell and that the output signals are assigned the contents of the respective address of the memory cell. The memory cells can be e.g. RAM cells of an FPGA or of some other programmable chip or ROM cells. An important advantage of this embodiment is to be seen in that the total execution time can be reduced even in the case of complex circuits comprising a plurality of gates, since the RAM cells have a fixed (and also fast) timing behavior. Furthermore it is possible that the RAM cells can map input signal functions which map 12 or more inputs.

As a result of the above described mapping of the code to RAM cells by means of the synthesis tool, a further feature of this embodiment is to be seen in that a state machine of this type can also be modified dynamically. In other words, the state machine can also be modified without the need to reconfigure or at least partially reconfigure the FPGA. This can prove very advantageous, in particular in the case of a rapid switching of algorithms.

The main applications of the method according to the invention will relate to automatic code generation by means of the use of an already described graphical representation with permanently defined syntax, wherein a code is generated from the graphical representation by means of the method according to the invention, which code dispenses with the use of the case state vector. An alternative application is, however, equally to be seen within the framework of the manual production of the code. If, for example, the VHDL code is entered by hand using a text editor, the method according to the invention can equally be made use of in that a new syntax or, as the case may be, a new syntactical description for finite state machines is made available to a hardware description language for implementation in programmable logic or in permanently coded, so-called "hard-coded", logic. The new syntax is characterized—as already stated in the foregoing—in that it dispenses, at least in a functional sense (i.e. in respect of the subsequent synthesis of the generated code), with the case state vector construct. This is made possible by resorting to a new assignment, concatenation and/or querying of input signals, output signals and the respective states. As well as the input state (this term is also used synonymously with the term "initial state") and the target state, the states include a (usually greater) number of intermediate states.

A further solution to the problem addressed by the invention is to be seen in a more complex product, specifically in a combined code generation and synthesis tool. In functional terms this product includes both the functionality of the code generation and the functionality of the subsequent synthesis of the generated code. In other words, this further inventive solution is to be seen in a type of product in which the method according to the invention is utilized. Further inventive solutions relate to the code generator according to the invention and a computer program product as claimed in the accompanying independent main claims.

The above described inventive embodiments of the method can also be realized as a computer program product, wherein the computer is prompted to perform the above described method according to the invention and its program code is executed by a processor.

An alternative inventive solution provides a storage medium which is intended to be used for storing the above described computer-implemented method and can be read by a computer.

Further advantageous embodiments may be derived from the dependent claims.

BRIEF DESCRIPTION OF THE DRAWINGS

In the following detailed description of the figures, exemplary embodiments which are not be understood in a restrictive sense are discussed, together with their features and further advantages, with reference to the drawing, in which:

FIG. 2 shows an exemplary representation of a graphical description for the coding of state machines, FIG. 3a shows an example of a known case state vector construct which, in the case of the inventive solution, is added merely as a comment and, in comparison therewith:

FIG. 3b shows a structure according to the invention of an individual bit of a state vector, FIG. 4a shows an example of signal declarations according to a known method from the prior art and, in comparison therewith:

FIG. 4b shows an example of a signal declaration according to the inventive method, FIG. 5 shows an example of a state vector which is included only in a symbolic manner in the solution according to the invention, FIG. 6 shows an example of the processing of undefined signals according to the inventive method, FIG. 7b shows a section from a screen display of a synthesis report according to the inventive method.

DETAILED DESCRIPTION OF THE INVENTION

In the following the basic environment of a code generator for generating hardware logic shall be described in connection with FIG. 1.

Figure 1:
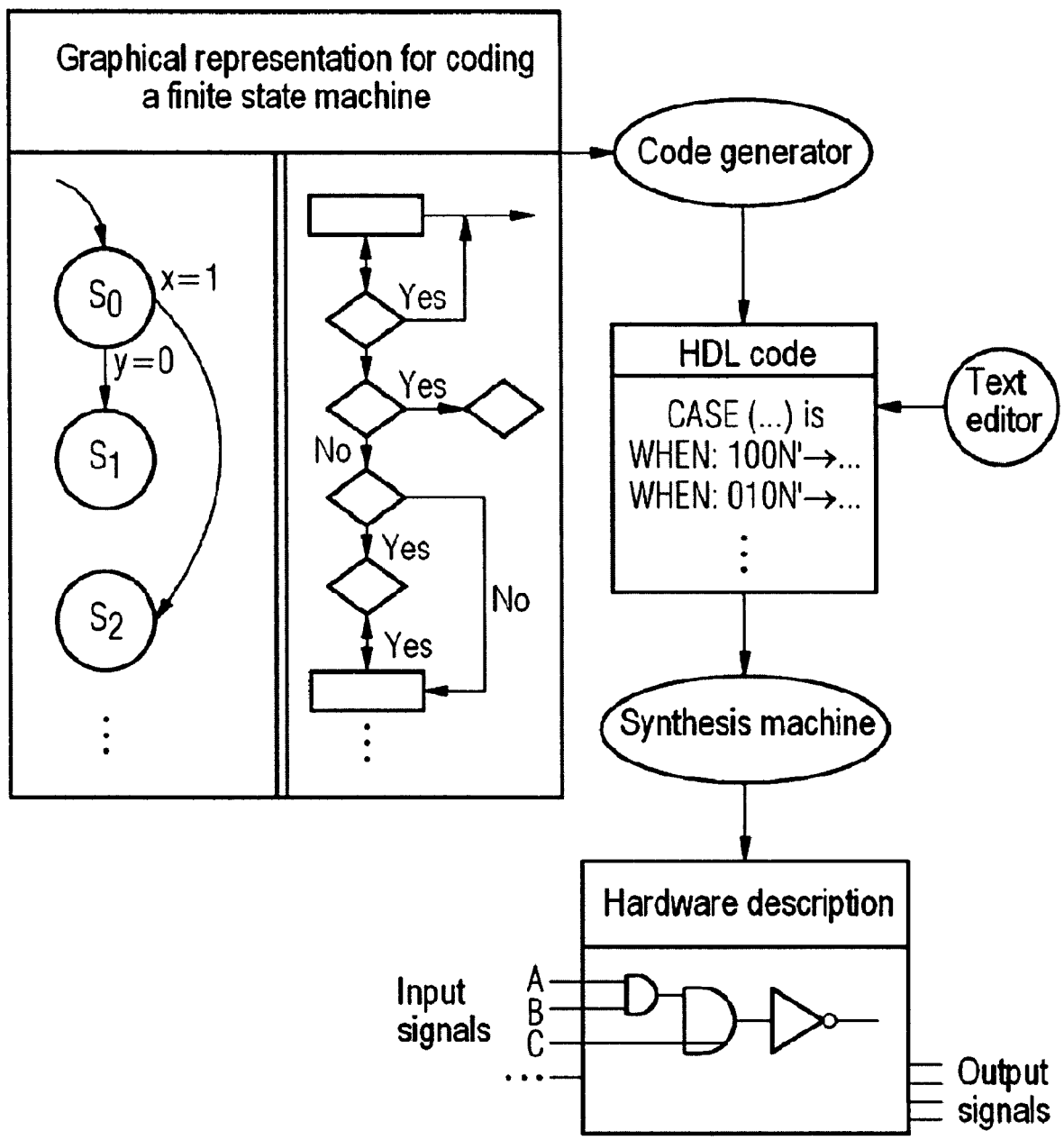
FIG. 1 shows an overview-like representation as part of the code generation for implementation in programmable logic.

As represented in FIG. 1 by the round element on the right-hand side, it is possible to use a graphical description for coding what are referred to as finite state machines which describes the functional linking of input signals, states and output signals in a clearly structured way. This graphical representation is based on a permanently defined syntax. From this graphical representation a code generator now generates an HDL code, e.g. VHDL or Verilog code or similar.

As shown in FIG. 1, it is equally possible to generate the HDL code directly and by hand using a text editor.

After the generation of the HDL code, the latter is supplied to a synthesis tool which thereupon generates a description of the hardware logic.

An example of such a graphical representation for coding a finite state machine is shown in FIG. 2. The lozenge-shaped boxes are typically queries whose results influence the further behavior of the state machine and therefore represent state transitions. The rectangular boxes represent states. An important advantage in the use of a graphic of this kind is to be seen in the uniqueness of the generated code and the freedom from syntactical errors or, alternatively, in the generation of a functionally correct VHDL code.

A problem with the previous code generation methods based on these graphics is to be seen in the fact that the generated code exhibits a lack of efficiency, even if a one-hot coding technique is used in which one state is described in each case by one bit in the state vector. With one-hot coding, the entire state vector is usually realized in code, resulting overall in performance losses.

Manual coding has the disadvantage that ambiguous state machines can easily be produced.

FIG. 3a shows an example of a case state vector construct which is used in the prior art code generation methods. With this case state vector construct, state transitions are generally executed as a function of the entire state vector.

The query structure of the existing case state vector constructs that are used in the existing prior art methods is a forward-directed query which, starting from an initial state and corresponding input signals, leads to a target state.

In contrast thereto, a different query structure is used according to the invention, as illustrated by way of example in FIG. 3b. FIG. 3b shows an individual bit of the state vector, the entire state vector being represented as an aggregate of the individual bits. According to the invention this is a backward-directed query which, starting from a target state (the relevant bit), queries which combination of input signals and initial states must be fulfilled in order to reach said target state. The starting point of the query structure according to the invention is therefore the target state. The end point of the query structure according to the invention is the input state, where applicable with respectively assigned input signals. This represents the core point of the solution according to the invention, which is to say that a modified query structure in respect of input signals, output signals, input state and end state is used. The result is that the code generated using this query structure no longer requires decoding.

A further feature of the solution according to the invention is to be seen in that internal intermediate signals are dispensed with to the greatest possible extent. An example is seen in the modified signal declaration.

FIG. 4a shows a signal declaration according to a method from the prior art. In contrast thereto, FIG. 4b shows a signal declaration according to the inventive method, which is self-evidently considerably shorter. In the signal declaration according to the invention, only what is absolutely necessary is declared and used, although the full functionality is preserved.

As already mentioned, it is possible, in an advantageous development of the invention, to include the existing state vector which is based on a forward-directed query structure (and is used in the prior art) merely as a comment so that, although it is contained in the generated code and may possibly facilitate a subsequent debugging, it is not taken into account in the subsequent synthesis. As shown in FIG. 5, the state vector is embedded in what is referred to as a pragma construct, which essentially acts as a comment that is not to be executed in an HDL code. The code embedded in the pragma construct remains hidden from the synthesis tool and consequently serves merely to simplify debugging in the course of the simulation; advantageously this does not lead to additional gates.

The previous code (or synonymous therewith: the code with the prior art query structure) performs a check for each query of an input signal in order to verify whether the input signal has a defined or, as the case may be, specific value (0 or 1) and interprets the input signal only after said query. The result of this is that the finite state machine with the query structure from the prior art is very sensitive to undefined signals during the simulation. With the known query structure from the prior art it is not possible, for example, to suppress the undefined signals e.g. by means of a logical combination with another signal.

In contrast thereto, in the case of the code generated according to the invention (and synonymous therewith: with the code with the query structure according to the invention) the processing or, as the case may be, handling of the undefined signals is determined by the logic equation. That is to say that undefined signals are only propagated if the logic equation allows this. This is much closer to the real behavior of the logic. This is shown by way of example in FIG. 6.

A number of advantages are produced with the solution according to the invention:
   Improved processing of undefined signals, as already mentioned in the foregoing.
   A much higher simulation speed can be achieved, since less code needs to be processed and it is not necessary to evaluate multiple, so-called multithreaded statements. The prior art code has e.g. 570 lines of VHDL text, whereas the code generated according to the invention comprises only 159 lines.
   Further advantages lie in the generation (synthesis) of fewer cells (LCs—Logic Cells), and in the fact that less decoding logic (LUT) is necessary, and not least in that a higher clock frequency of the circuit can be achieved.
   A further advantage of the solution according to the invention is to be seen in that the code generator according to the invention is totally independent of the content of the code that is to be produced or, as the case may be, independent of the logic circuit and so can be used for different applications with complete flexibility.

Figure 7A:
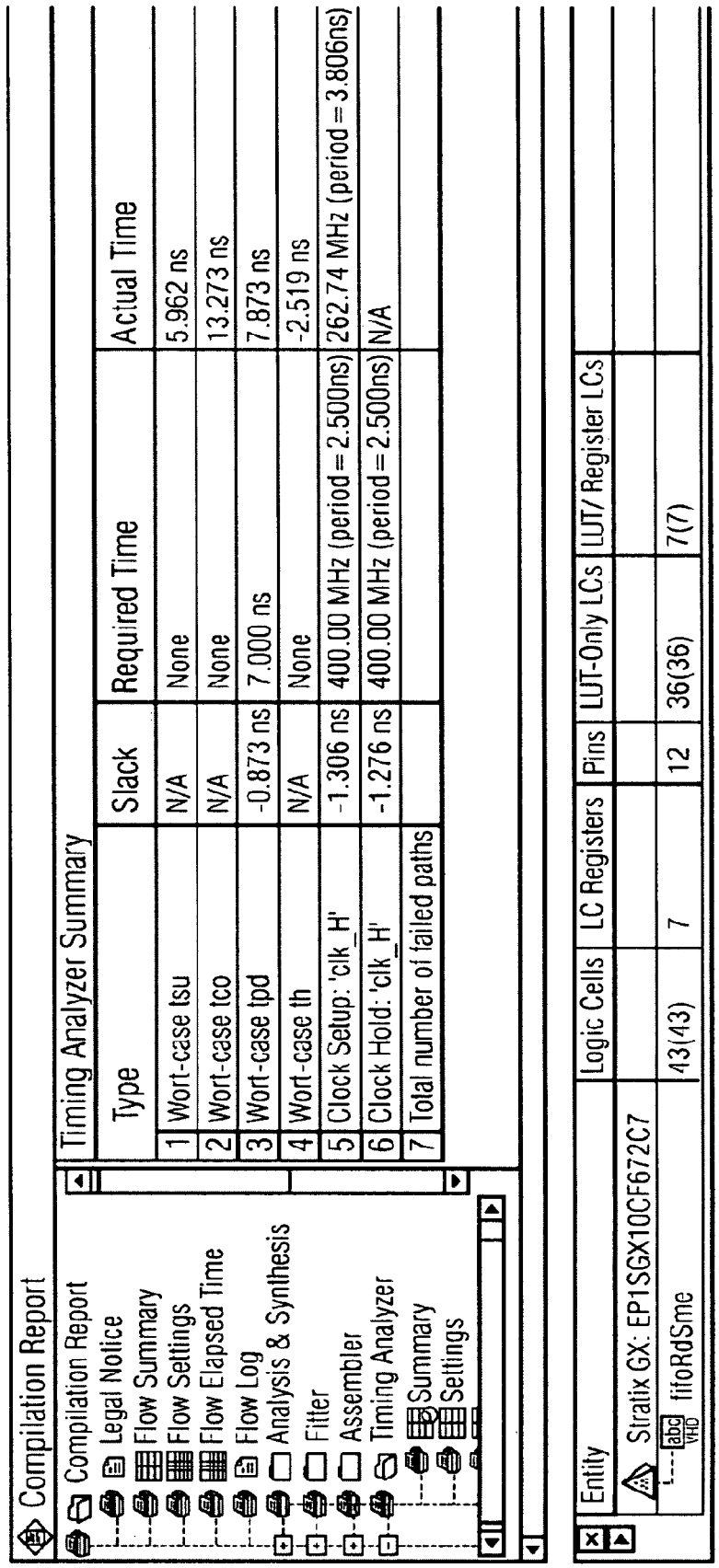
FIG. 7a shows a section from a screen display of a synthesis report in a method from the prior art.

FIG. 7a shows a section of a compilation report which represents the result of a synthesis of a known code generator from the prior art. In this case the number of logic cells is 43, the number of LC registers 7, the number of pins used 12, the number of LUT-only LCs 36, and the number of LUT/register LCs 6.

In contrast thereto, FIG. 7b shows the result that can be achieved by means of a method according to the invention. In this case the number of logic cells is now only 17 (as opposed to 43 formerly) and the number of LUT-only LCs has decreased from 36 to 11. This clearly demonstrates the significant increase in performance which is reflected both in the higher clock frequency (266 MHz to 377 MHz) and in the combinatorial signals (tpd from 7.8 ns to 6.9 ns).

In an advantageous development it is provided that the VHDL or Verilog code is generated in such a way that said generated code is mapped by a known synthesis tool from the prior art (e.g. from Mentor Graphics, Altera or Xilinx or Synopsys or Synplicity) to what are termed RAM cells of an FPGA. This is interesting in particular in the case of such state machines in which, in spite of an optimized description, the decoding logic (for state vector and output signals) becomes so large that a number of look-up tables must be cascaded. In such a case, where cascading of this kind is necessary, this disadvantageously leads with the existing systems from the prior art to a slowing of the clock frequency. For this reason a mapping to RAM cells is proposed which have a fast timing and can map 12 or more inputs (in comparison therewith, a look-up table comprises only 4 to 6 inputs, depending on the IC family). With this form of description the logic equation must be mapped into a table for a memory cell, e.g. a ROM.

The following type and signal declaration is used for this:

```
TYPE SME_RamTypeIS array (0 to 16383) of
std_logic_vector(5 downto 0); -defines the ram
matrix SIGNAL SME_RamCells: SME_RamType:=
-- define the actual ram cells
-- RamOut - RamIn ArrayIndex
("000000", - 00000000000000 0
 "001000", - 00000000000001 1
 "000101", - 00000000000010 2
and a signal assignment such as:
SME_RamOuts <=
SME_RamCells(CONV_INTEGER(SME_RamAdress));
```

As an alternative to the foregoing declaration, the RAM can, of course, also be instantiated from the vendor-specific libraries. Said RAM can then be initialized by means of initialization files during the loading of the FPGA.

As already mentioned, a state machine of this kind can also be modified dynamically, in particular when a fast switching of algorithms is necessary.

In conclusion it should be pointed out that the above description of the invention and the exemplary embodiments shown are fundamentally not to be understood as restricting in terms of a particular physical implementation of the invention and consequently can also be modified in the most diverse ways without leaving the scope of the invention. For a person skilled in the art it is obvious in particular that the invention can also be realized as a heterogeneous system, partially or entirely on the basis of software and/or hardware modules and/or distributed over a plurality of physical products, in this case in particular also as computer program products. Furthermore it is possible to utilize the solution according to the invention as a module in order to integrate it into existing systems.

The invention claimed is:

1. A method for automatically generating an HDL code based on a graphical representation for coding a state machine, comprising:
   executing by a computer state transitions of the state machine by a backward-directed query starting from a target state; and
   reaching the target state based on the backward-directed query,
   wherein a state vector of the generated code is not used in a subsequent synthesis.

2. The method as claimed in claim 1, wherein the target state is reached by deriving which precondition of an input signal must be fulfilled in order to reach the target state.

3. The method as claimed in claim 1, wherein the target state is reached by deriving which precondition of a preceding state must be fulfilled in order to reach the target state.

4. The method as claimed in claim 1, wherein a processing of an internal intermediate signal is dispensed with if possible.

5. The method as claimed in claim 1, wherein the generated code is mapped to a memory cell so that input signals and a combination of input signals are mapped to an address of the memory cell and output signals are assigned to a content of the address of the memory cell.

6. The method as claimed in claim 1, wherein the generated code does not have to be decoded.

7. The method as claimed in claim 1, wherein the generated code is implemented in a hardware.

8. A code generator for generating an HDL code based on a graphical representation for coding a state machine, comprising:
   a query module that initiates a backward-directed query starting from a target state of the state machine; and
   a synthesis device that reaches the target state based on the backward-directed query,
   wherein a state vector of the generated code is not used in a subsequent synthesis.

9. The code generator as claimed in claim 8, wherein the synthesis device derives which precondition of an input signal must be fulfilled in order to reach the target state.

10. The code generator as claimed in the claim 9, wherein the synthesis device derives which precondition of a previous state must be fulfilled in order to reach the target state.

11. A computer readable medium comprising computer program, when executed by a computer, cause the computer to generate an HDL code based on a graphical representation for coding a state machine, the computer program comprising:
    a computer sub program that executes state transitions of the state machine by a backward-directed query starting from a target state; and
    a computer sub program that reaches the target state based on the backward-directed query,
    wherein a state vector of the generated code is not used in a subsequent synthesis.

12. The computer readable medium as claimed in the claim 11, wherein the target state is reached by deriving which precondition of an input signal must be fulfilled in order to reach the target state.

13. The computer readable medium as claimed in the claim 11, wherein the target state is reached by deriving which precondition of a previous state must be fulfilled in order to reach the target state.

* * * * *